United States Patent
Hasran et al.

(10) Patent No.: US 8,423,932 B1
(45) Date of Patent: Apr. 16, 2013

(54) BLOCK EMULATION TECHNIQUES IN INTEGRATED CIRCUITS

(75) Inventors: Syamsul Hani Hasran, Paya Dalam (MY); Ian Eu Meng Chan, Ipoh (MY); Wai Loon Ho, Ipoh (MY); Lee Shyuan Heng, Bukit Mertajam (MY); Min Meng Loo, Lebuh Tunku Kudin 2 (MY); Mohd Yusuf Abdul Hamid, Taman Desa Relau (MY)

(73) Assignee: Altera Corporation, San Jose, CA (US)

( * ) Notice: Subject to any disclaimer, the term of this patent is extended or adjusted under 35 U.S.C. 154(b) by 165 days.

(21) Appl. No.: 12/794,647

(22) Filed: Jun. 4, 2010

(51) Int. Cl.
*G06F 17/50* (2006.01)

(52) U.S. Cl.
USPC .......................................... 716/106; 716/108

(58) Field of Classification Search ........... 716/106–109
See application file for complete search history.

(56) References Cited

U.S. PATENT DOCUMENTS

| | | | | |
|---|---|---|---|---|
| 7,356,454 | B2 * | 4/2008 | Sakane et al. | 703/23 |
| 2004/0073882 | A1 * | 4/2004 | Osann, Jr. | 716/16 |
| 2006/0247909 | A1 * | 11/2006 | Desai et al. | 703/23 |

* cited by examiner

*Primary Examiner* — Binh Tat
(74) *Attorney, Agent, or Firm* — Womble Carlyle Sandridge & Rice, LLP

(57) ABSTRACT

Techniques for generating an emulated logic block are provided. The techniques include identifying a logic block in one integrated circuit (IC) design that needs to be emulated in another IC design. The logic block may be a physical logic block on the IC design and a non-existent logic block on the other IC design. Logic elements are used to form an emulated logic block that shares substantially the same functionality as the actual logic block. The logic elements are connected to perform logic functions associated with the actual logic block and are grouped together to form an emulated logic block based on the actual logic block.

10 Claims, 9 Drawing Sheets

BLOCK EMULATION TECHNIQUES IN INTEGRATED CIRCUITS

BACKGROUND

Programmable logic devices (PLDs) such as field-programmable gate arrays (FPGAs) and application-specific integrated circuits (ASICs) are integrated circuits (ICs) devices that include generic structures and logic blocks that can be configured to perform different functions. Some of these logic blocks include logic circuitry, registers, I/O blocks, digital signal processing (DSP) blocks, one-time programmable (OTP) fuse blocks, etc. These circuitry elements are programmable to perform any of a variety of tasks and functions.

Generally speaking, a particular circuit design on one IC device can be migrated to another device. For instance, a circuit design originally intended for an ASIC device may be migrated to a corresponding FPGA device, and vice versa. A software design tool is generally used to compile such a circuit design and migrate or convert an implementation of that design on one device to a functionally equivalent device.

Typically, when converting or migrating from one device to another, the functional equivalence between both devices needs to be preserved. In some cases, this includes maintaining a 1-to-1 block mapping between the devices. In other words, logic blocks that exist in one device must be mapped to an equivalent or identical block in a corresponding device. For instance, in order to successfully migrate a design implemented on an ASIC device to an FPGA device, there needs to be a corresponding logic block in the FPGA device for every logic block utilized in the ASIC device. Generally speaking, a design implemented on an ASIC device that includes, for example, an OTP fuse block, cannot be migrated to an FPGA device that does not include an OTP fuse block. In that sense, there is a certain restriction on the selection of devices when it comes to migrating or converting an ASIC design to an FPGA design, and vice versa.

However, if IC devices can be configured to emulate logic blocks that may not be physically present on the device, migrating an IC design from one device to another will be much simpler. For instance, a design implemented on an ASIC device that includes an OTP fuse block can now be migrated to an FPGA device that does not include an OTP fuse block, as long as the FPGA device can be configured to emulate the functionality of an OTP fuse block. This substantially increases the level of flexibility when it comes to migrating an IC design from one device to another.

Therefore, it is desirable to have a mechanism or technique to emulate logic blocks on an IC device using resources that are available on the IC device. As such, an IC design implemented on a particular device can be easily migrated to and implemented on another device without being restricted to a 1-to-1 logic block mapping between the two devices.

It is within this context that the invention arises.

SUMMARY

Embodiments of the present invention include techniques for emulating a logic block on an integrated circuit (IC).

It should be appreciated that the present invention can be implemented in numerous ways, such as a process an apparatus, a system, a device or a method on a computer readable medium. Several inventive embodiments of the present invention are described below.

In one embodiment, a method of generating an emulated logic block is disclosed. The method includes identifying a logic block in a first IC design that needs to be emulated in a second IC design. A plurality of logic elements in the second IC design that is connectable to form an emulated logic block based on the logic block in the first IC design is determined. The plurality of logic elements is connected to perform logic functions associated with the logic block in the first IC design. The connected logic elements are then grouped as a block to form an emulated logic block in the second IC design that is functionally comparable with the logic block in the first IC design.

In another embodiment, a method for emulating a logic block in an IC is disclosed. The method includes identifying a plurality of smaller logic elements that are connectable to form the logic block to be emulated. Each of the plurality of logic elements is flagged to indicate that each element is a logic element in an emulated logic block. The plurality of logic elements are connected to receive input signals and perform logic functions associated with the logic block. A boundary is placed around the logic elements to form an emulated logic block.

In yet another embodiment in accordance with the present invention, a machine-readable storage medium encoded with sequences of instructions for compiling an IC design is disclosed. The machine-readable medium has instructions for identifying a logic block in a first IC design that is a non-existent logic block in a second IC design. The machine-readable medium also includes instructions for identifying a plurality of logic elements in the second IC design that can be connected to perform functions associated with the logic block identified in the first IC design. The machine-readable medium further includes instructions for placing a partition around the logic elements to form an emulated logic block in the second IC design and comparing the emulated logic block in the second IC design with the logic block in the first IC design.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings.

DETAILED DESCRIPTION

The following embodiments describe techniques for emulating a logic block on an integrated circuit (IC).

It will be obvious, however, to one skilled in the art, that the present invention may be practiced without some or all of these specific details. In other instances, well-known operations have not been described in detail in order not to unnecessarily obscure the present invention.

The embodiments described herein provide techniques to emulate a logic block within an IC design using readily available resources of the IC design. For instance, an IC design without a physical digital signal processing (DSP) block can emulate such a block by using various available resources. In one of the embodiments, multiple logic elements are connected to perform a variety of functions associated with a particular logic block. The logic elements are then grouped together to form a block of logic elements. This block of logic elements is a logic block that emulates the functions of that particular logic block. In other words, the grouped logic elements form an emulated logic block that operates substantially similarly to the particular logic block that is being emulated. The emulation technique in one of the described embodiments also allows IC designs to be easily converted and implemented on different IC devices.

Figure 1:
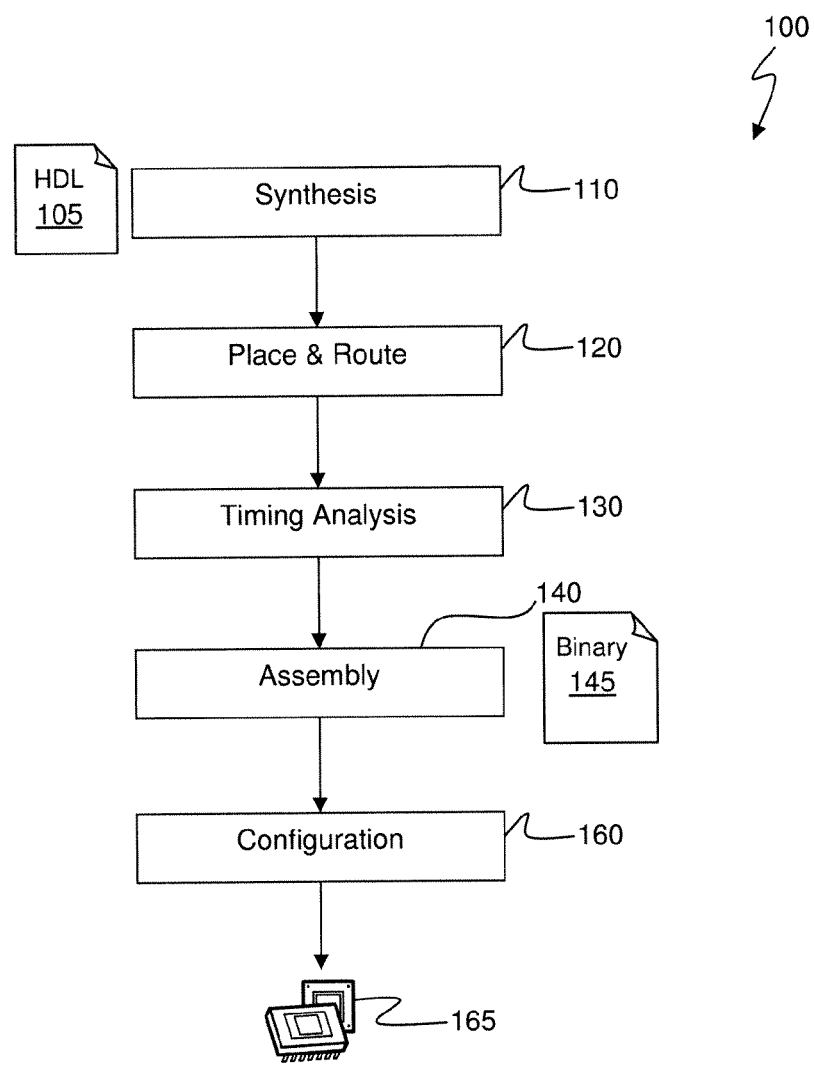
FIG. 1, meant to be illustrative and not limiting, shows a compilation flow to create a compiled design for an IC using an electronic design automation (EDA) tool, according to one embodiment.

FIG. 1, meant to be illustrative and not limiting, shows compilation flow 100 to create a compiled design for an IC using an electronic design automation (EDA) tool, according to one embodiment. The flow starts with an IC design created by a circuit developer or a hardware engineer that is embodied in a hardware description language (HDL) file 105. The IC design embodied in the HDL file is synthesized and translated into a discrete netlist of logic-gate primitives during synthesis operation 110. The synthesized logic gates and other components in the IC design are placed on the IC device during place and route operation 120. Wires are also added to connect the logic gates and all the other components in the IC to route signals in the IC design during place and route operation 120.

Referring still to FIG. 1, after place and route operation 120, timing analysis operation 130 assigns delays to the different logic gates and wires or routes in the circuit. Timing analysis operation 130 computes the lengths of different paths in the IC design and the timing constraints of the IC design, in one embodiment. Binary configuration file 145 is created during assembly operation 140. In one embodiment, binary configuration file 145 contains a description of the circuit of the IC design and is used to configure IC device 165 with the IC design during configuration operation 160. One skilled in the art should appreciate that most operations shown in flow 100 are optional. In other words, certain operations may be skipped if desired without stopping the EDA tool from reaching a solution. However, the quality of the resulting IC design solution may be impacted by the removal of the optional operations.

Figure 2:
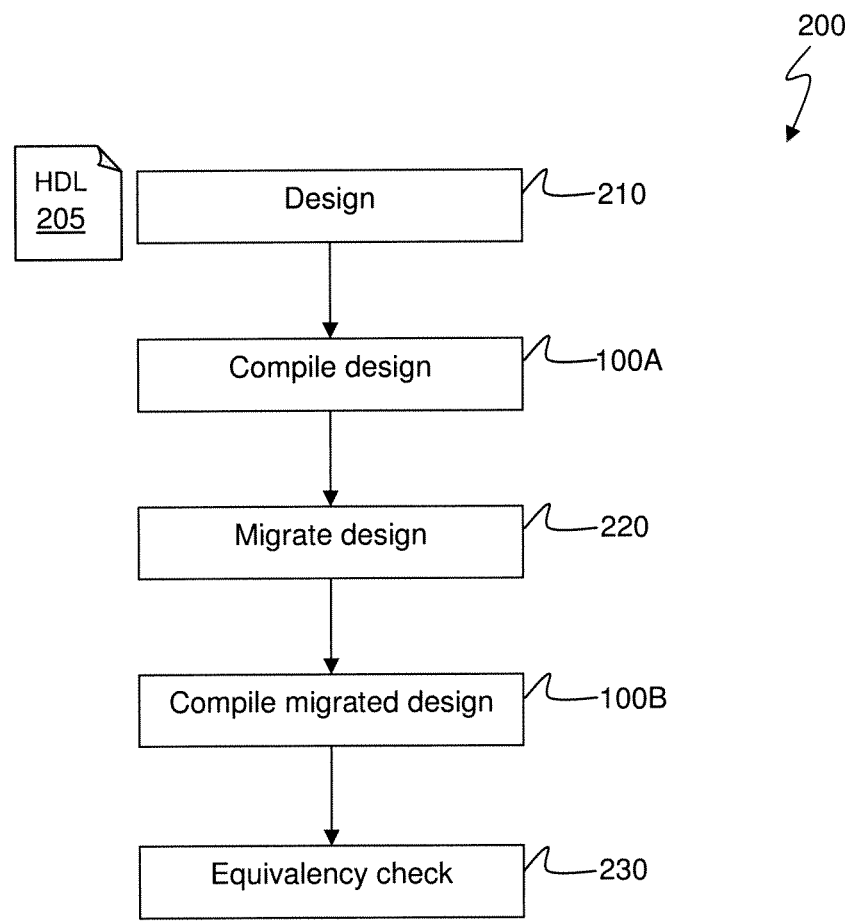
FIG. 2, meant to be illustrative and not limiting, shows a process flow for compiling an IC design for a particular IC device and migrating the design to a compatible design for another IC device.

FIG. 2, meant to be illustrative and not limiting, shows process flow 200 for compiling an IC design for a particular IC device and migrating the design to a compatible design for another IC device. Flow 200 begins with design operation 210. During design operation 210, a user, e.g., a circuit designer, creates an IC design described in hardware description language (HDL) file 205. The IC design is compiled in operation 100A. Compile operation 100A is similar to compilation flow 100 as shown in FIG. 1. After the IC design has been fully compiled, the IC design is migrated in operation 220. At this point, the compiled IC design can be used to configure an IC device, e.g., a field-programmable gate array (FPGA) device. Migration operation 220 migrates or converts the IC design to a compatible design for another IC device. For instance, if the IC design described in HDL 205 is an FPGA design, the design can be migrated to a compatible application specific integrated circuit (ASIC) device, or more specifically, a structured ASIC device, in operation 220.

Referring still to FIG. 2, the migrated design is compiled in operation 100B. Compile operation 100B includes the steps shown in flow 100 as seen in FIG. 1. An equivalency check is performed in operation 230 after the compilation. In one embodiment, the equivalency check performed in operation 230 checks that every logic block in the original design prior to the migration maps to a corresponding logic block in the migrated design. For instance, if the IC design as described in HDL 205 is to be implemented on a structured ASIC device that includes a one-time programmable (OTP) fuse block, the IC device that the migrated design is targeted to needs to have a similar OTP fuse block. Otherwise, the migrated design will fail the equivalency check in operation 230. As such, an IC design intended for a specific IC device can only be implemented in a compatible device if there is a 1-to-1 block mapping between both the devices.

Figure 3A:
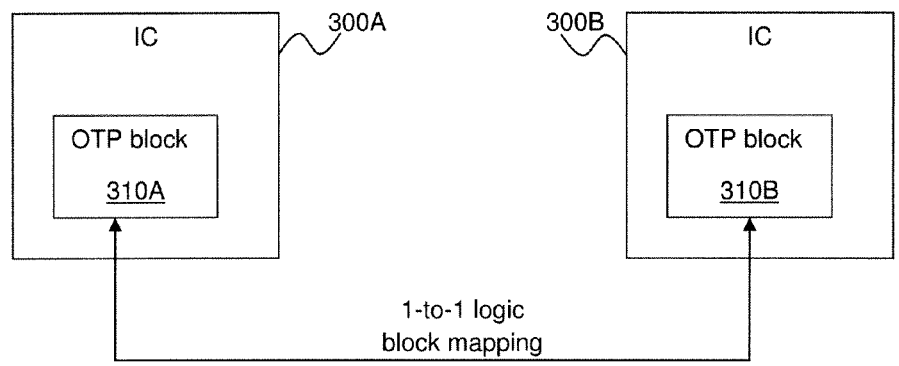
FIG. 3A, meant to be illustrative and not limiting, shows a 1-to-1 logic block mapping between two IC devices.

FIG. 3A, meant to be illustrative and not limiting, shows a 1-to-1 logic block mapping between two IC devices. In the embodiment of FIG. 3A, IC devices 300A and 300B each include an OTP block, i.e., OTP block 310A and 310B, respectively. In that sense, there is a 1-to-1 logic block mapping between IC devices 300A and 300B and the corresponding design for the IC devices. It should be appreciated that an OTP block is shown in FIG. 3A for the sake of simplicity although an IC device usually includes multiple logic blocks and other generic structures.

Figure 3B:
FIG. 3B, meant to be illustrative and not limiting, shows a block mapping between an emulated logic block and an OTP block as one embodiment in accordance with the present invention.

FIG. 3B, meant to be illustrative and not limiting, shows a block mapping between emulated logic block 350 and OTP block 330B as one embodiment in accordance with the present invention. In the embodiment of FIG. 3B, IC device 320A does not include a physical OTP block. IC device 320B, on the other hand, includes physical OTP block 330B. As such, if an IC design for IC device 320B were to be migrated to IC device 320A, OTP block 330B on IC device 320B cannot be mapped to a corresponding OTP block on IC device 320A. However, logic elements 322 that are available on IC device 320A that are connectable to perform logic functions similar to that of OTP block 330B can be grouped together in the design to form an emulated OTP block 350, according to one embodiment. Emulated logic block 350 on IC device 320A can be mapped to OTP block 330B on IC device 320B. Therefore, according to one embodiment, IC design intended for IC device 320B can be migrated to IC device 320A even though there may not be an actual OTP block on IC device 320A.

Figure 3C:
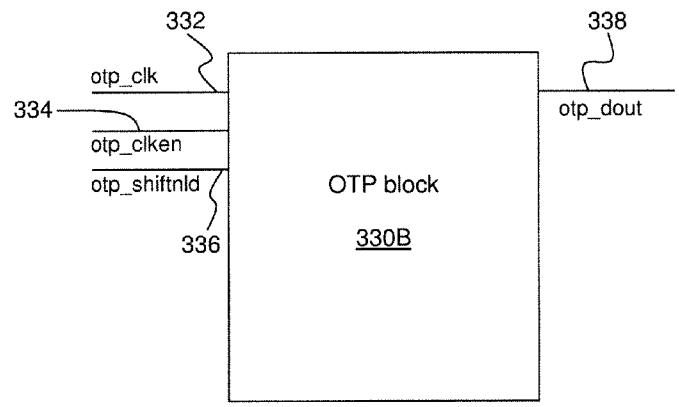
FIG. 3C, meant to be illustrative and not limiting, shows a more detailed representation of an OTP block with three input terminals and one output terminal.

FIG. 3C, meant to be illustrative and not limiting, shows a more detailed representation of OTP block 330B of FIG. 3B with three input terminals and one output terminal. In the embodiment of FIG. 3C, OTP block 330 has otp_clk terminal 332, otp_clken terminal 334, otp_shiftnld terminal 336 and otp_dout terminal 338. A logic block that emulates OTP block 330B will include three input terminals and an output terminal. In the embodiment of FIG. 3B, emulated block 350 will include three input terminals and an output terminal to mirror the functionality of OTP block 330B.

Figure 3D:
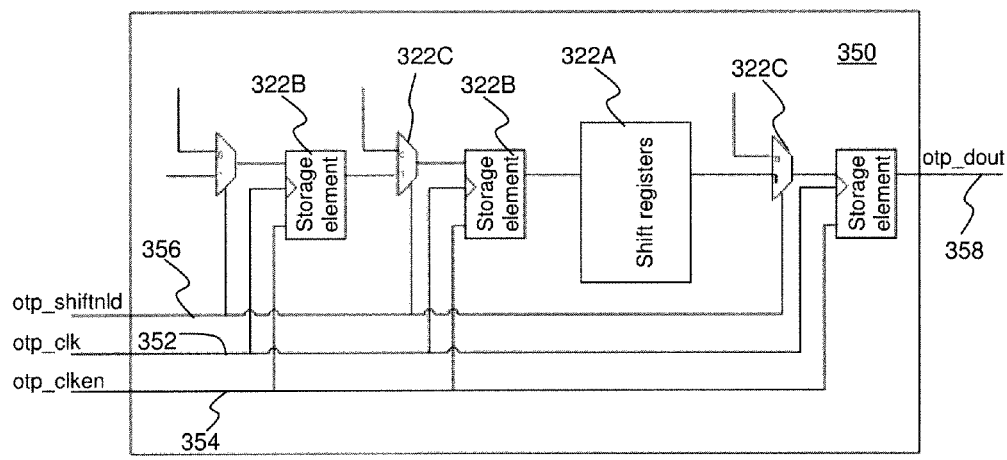
FIG. 3D, meant to be illustrative and not limiting, shows a detailed representation of an emulated logic block, as one embodiment in accordance with the present invention.

FIG. 3D, meant to be illustrative and not limiting, shows a detailed representation of emulated logic block 350, as one embodiment in accordance with the present invention. Emulated logic block includes three input terminals otp_clk 352, otp_clken 354 and otp_shiftnld 356 and output terminal otp_dout 358. In the embodiment of FIG. 3D, emulated logic block 350 includes a block of shift registers 322A coupled to multiple registers or storage elements 322B and multiplexers 322C. One skilled in the art should appreciate that storage elements 322B refer to all kinds of storage circuits, such as latches, flip flops, etc., that are generally used in ICs. Well known functions or constructions and connections between all the logic elements 322A-322C are not described in detail so as to not obscure the present invention. It should be appreciated that even though a block of shift registers 322A is used to emulate OTP block 330B in the embodiment of FIG. 3D, other logic elements can be used to emulate OTP block 330B. For instance, counters, read-only memory (ROM) blocks, look-up tables (LUTs), etc. can be used to emulate such a block. It should also be appreciated that even though an OTP block is used in this context, any logic block can be emulated if desired.

Figure 4:
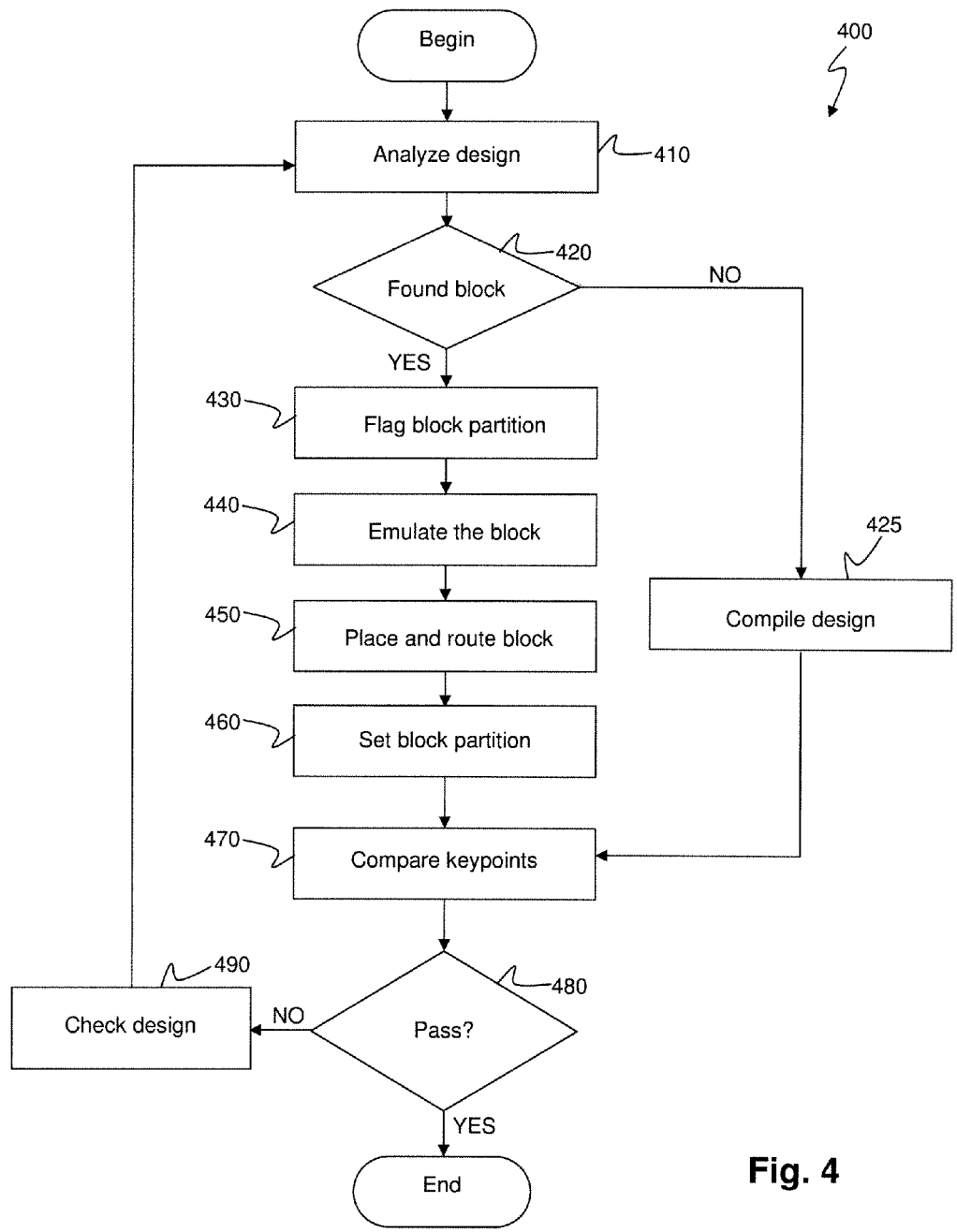
FIG. 4, meant to be illustrative and not limiting, shows a process flow for emulating a logic block as another embodiment in accordance with the present invention.

FIG. 4, meant to be illustrative and not limiting, shows process flow 400 for emulating a logic block as another embodiment in accordance with the present invention. Process flow 400 begins by analyzing an IC design in operation 410. In one embodiment, the analyzing of the IC design in operation 410 includes converting a register transfer level (RTL) description of the IC design to a software data structure or hierarchy that represents different blocks in the IC design. A search can be performed in operation 420 on the data structure to identify logic blocks that need to be emulated. For instance, certain logic blocks that are needed in the IC design but do not physically exist on the design of the programmable device are emulated with logic blocks or resources that are available on the programmable device. In one embodiment, simpler or smaller logic elements are connected to emulate non-existent logic blocks. If a logic block that needs to be emulated in the IC design is found in operation 420, the block partition is flagged in operation 430. If there is no logic block that needs to be emulated in the IC design, the IC design is compiled in operation 425. In one embodiment, compile operation 425 is similar to the compilation flow 100 as shown in FIG. 1.

Referring still to FIG. 4, the logic block is emulated in operation 440. As an illustrative example, an OTP block is emulated in the IC design using logic elements as shown in the embodiment of FIG. 3D in operation 440. The logic elements in the emulated block are connected to receive input signals and perform logic functions associated with the actual logic block. The emulated block is placed and routed on the design of the programmable device in operation 450. Partition is set to form a boundary around the emulated block in the IC design in operation 460. In operation 470, keypoints between the emulated logic block and a known instance of the logic block are compared. In one embodiment, input and output terminals of the emulated logic block in the IC design are compared with respective input and output terminals on a known instance of a design of the logic block. In one embodiment, the comparison in operation 470 does not compare the internal logic elements within the logic block and the emulated logic block. If the comparison passes in operation 480, the emulated logic block can be used in place of a physical logic block in the IC design and process flow 400 is complete. Otherwise, the IC design is checked in operation 490 before process flow 400 is repeated.

Figure 5:
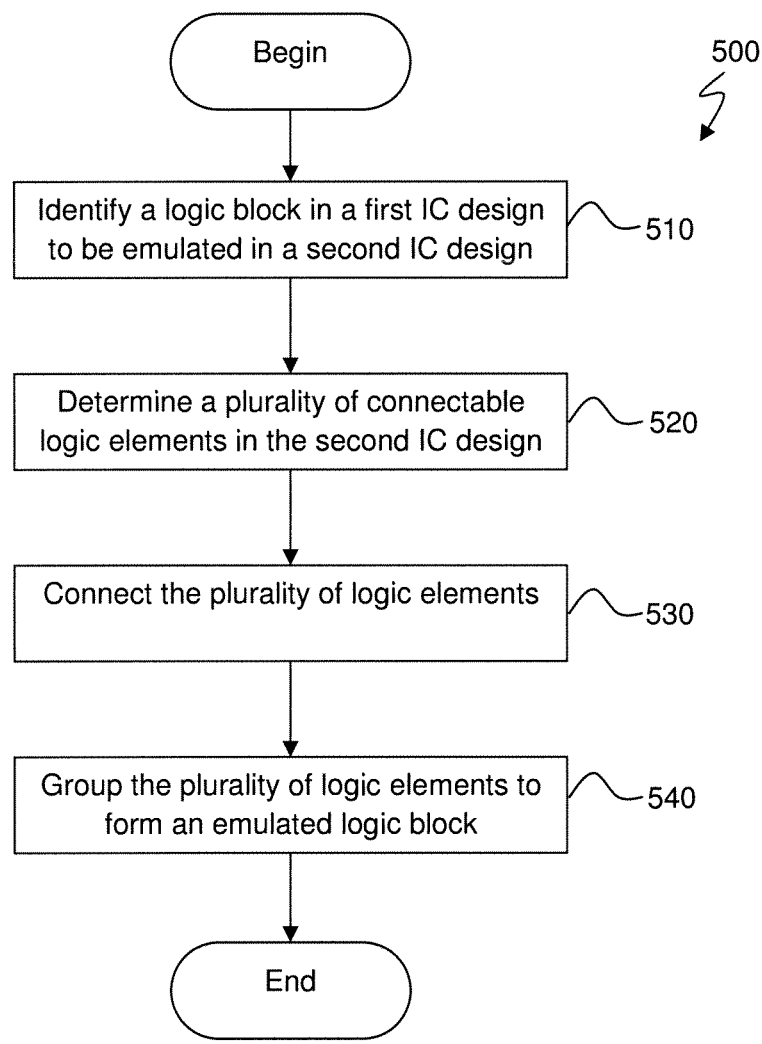
FIG. 5, meant to be illustrative and not limiting, shows a process flow for generating an emulated logic block as yet another embodiment in accordance with the present invention.

FIG. 5, meant to be illustrative and not limiting, shows process flow 500 for generating an emulated logic block as yet another embodiment in accordance with the present invention. Process flow 500 begins with identifying a logic block in a first IC design that needs to be emulated in a second IC design in operation 510. It should be appreciated that the first IC design may be an ASIC design and the second IC design may be an FPGA design, and vice versa. In one embodiment, the first and second IC designs are compared to identify a non-existent block in the second IC design. For instance, if the first IC design includes a DSP block and the second IC design does not, then the DSP block in the first IC design is emulated in the second IC design. In operation 520, logic elements in the second IC design that can be connected to form an emulated logic block based on the logic block identified in operation 510 are determined. In one embodiment, the hierarchy of the logic block to be emulated is determined in order to identify the logic elements that are connectable to form the emulated logic block. In an exemplary embodiment, each of the logic elements is flagged or tagged as an element in the emulated logic block in operation 520.

Continuing from FIG. 5, the plurality of logic elements are connected in operation 530. The connected logic elements are then grouped in operation 540 to form an emulated logic block. According to one embodiment, in operation 540, a boundary is created around the flagged logic elements in the second IC design. The emulated logic block formed in operation 540 is functionally equivalent to the logic block identified in operation 510. In one embodiment, the emulated logic block has keypoints that match with respective keypoints of the logic block in the first design. In the illustrative embodiment of FIGS. 3C and 3D, the keypoints, i.e., input and output terminals, on emulated logic block 350 match respective keypoints on OTP block 330B.

Figure 6:
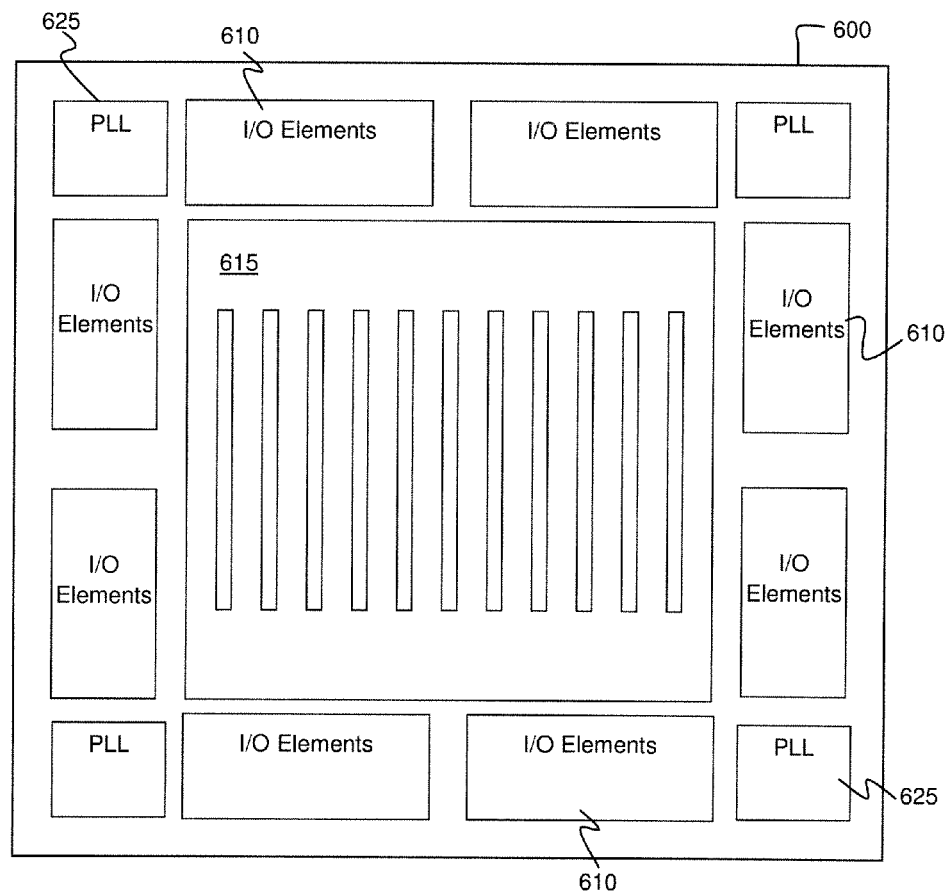
FIG. 6, meant to be illustrative and not limiting, shows a simplified block diagram of a programmable logic device (PLD) that can include aspects of the present invention.

FIG. 6, meant to be illustrative and not limiting, shows a simplified block diagram of PLD 600 that can include aspects of the present invention. Programmable device 600 includes logic region 615 and I/O elements 610. I/O elements 610 may support a variety of memory interfaces. Other auxiliary circuits such as phase-locked loops (PLLs) 625 for clock generation and timing, can be located outside the core logic region 615, e.g., at corners of programmable device 600 and adjacent to I/O elements 610. Logic region 615 may be populated with logic cells which include, among other things, at the most basic level, "logic elements" (LEs). LEs may include look-up table-based logic regions and these logic elements may be grouped into "Logic Array Blocks" (LABs). The logic elements and groups of logic elements or LABs can be configured to perform logical functions desired by the user. Logic region 615 may also include logic elements that can be configured to emulate a logic block, e.g., a DSP block, an OTP block, etc., similar to emulated logic block 350 shown in FIG. 3D.

Figure 7:
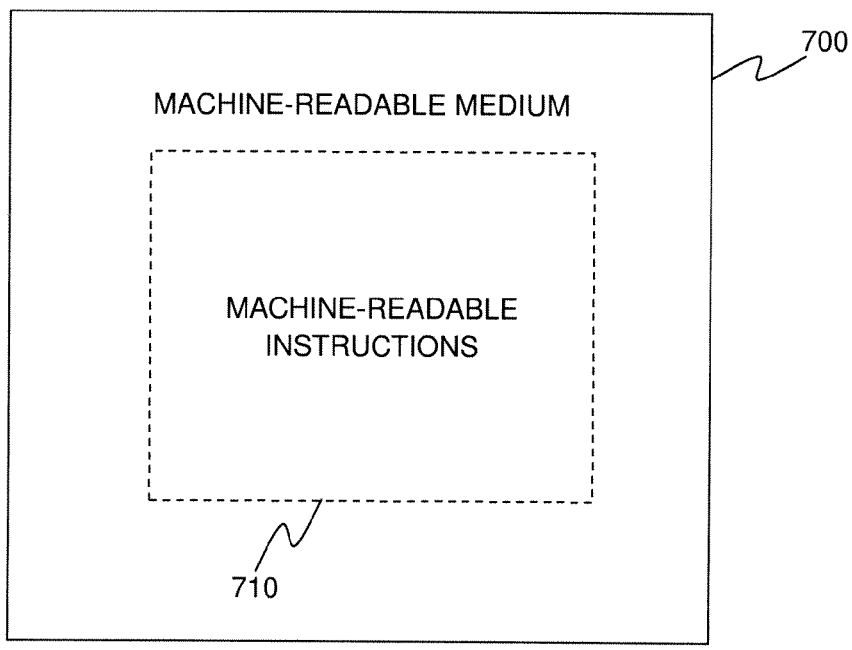
FIG. 7 is a simplified block diagram showing a machine-readable medium encoded with machine-readable instructions as an embodiment in accordance with the present invention.

The invention can also be embodied as machine-readable instructions 710 on machine-readable storage medium 700 as shown in FIG. 7. Machine-readable storage medium 700 is any data storage device that can store data, which can thereafter be read by a machine or a computer system. Illustrative examples of machine-readable storage medium 700 include hard drives, network attached storage (NAS), read-only memory, random-access memory, CDs, DVDs, USB drives, volatile and non-volatile memory, and other optical and non-optical data storage devices. Machine-readable storage medium 700 can also be distributed over a network-coupled computer system so that machine-readable instructions 710 are stored and executed in a distributed fashion. Machine-readable instructions 710 can perform any or all of the operations illustrated in FIGS. 1, 2, 4 and 5.

Figure 8:
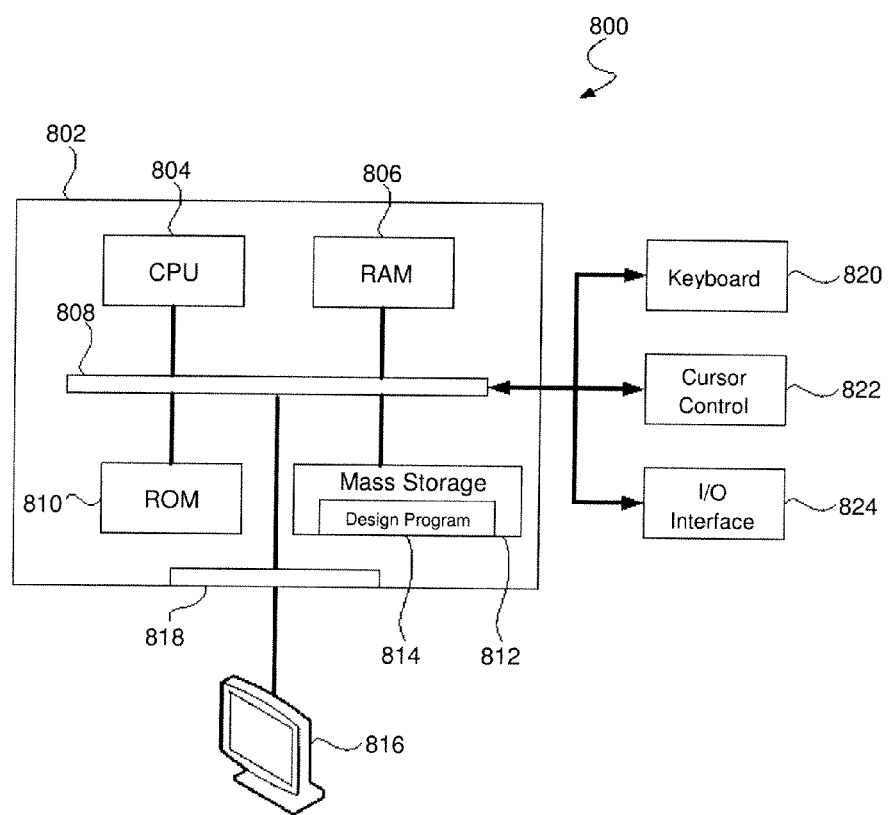
FIG. 8 is a simplified schematic diagram of a computer system for implementing embodiments of the present invention.

FIG. 8 is a simplified schematic diagram of a computer system 800 for implementing embodiments of the present invention. It should be appreciated that the methods described herein may be performed with a digital processing system, such as a conventional, general-purpose computer system. Special-purpose computers, which are designed or programmed to perform one function may be used in the alternative. The computer system includes a central processing unit (CPU) 804, which is coupled through bus 808 to random access memory (RAM) 806, read-only memory (ROM) 810, and mass storage 812. Mass storage device 812 represents a persistent data storage device such as a floppy disc drive or a fixed disc drive, which may be local or remote.

Referring still to FIG. 8, design program 814 resides in mass storage 812, but can also reside in RAM 806 during processing. According to one embodiment, design program 814 is an EDA tool, or module of an EDA tool, that can perform any or all of the operations illustrated in FIGS. 1 and 2 and additional functionality described herein. It should be appreciated that CPU 804 may be embodied in a general-purpose processor, a special-purpose processor, or a specially programmed logic device. Display 816 is in communication with CPU 804, RAM 806, ROM 810, and mass storage device 812, through bus 808 and display interface 818. Keyboard 820, cursor control 822, and interface 824 are coupled to bus 808 to communicate information in command selections to CPU 804. It should be appreciated that data to and from external devices may be communicated through interface 824.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of generating an emulated logic block, comprising:
   identifying a logic block in a first integrated circuit (IC) design to be emulated in a second IC design;
   determining a plurality of logic elements in the second IC design that are connectable to form the emulated logic block based on the logic block in the first IC design, wherein at least one of the plurality of logic elements in the second IC design is different from any logic elements from the logic block in the first IC design;
   connecting the plurality of logic elements in the second IC design to perform logic functions associated with the logic block in the first IC design; and
   grouping the plurality of connected logic elements as a block to form the emulated logic block in the second IC design, wherein the emulated logic block in the second IC design is functionally comparable to the logic block in the first IC design wherein the emulated logic block comprises a plurality of keypoints that matches respective keypoints of the logic block in the first IC design, wherein the plurality of keypoints comprises input and output terminals on the logic block and the emulated logic block and, wherein at least one method operation is executed through a processor.

2. The method of claim 1, wherein the identifying of the logic block to be emulated includes comparing the first IC design and the second IC design, and wherein the logic block in the first IC design is a non-existent block in the second IC design.

3. The method of claim 1, wherein the first IC design is an application specific integrated circuit (ASIC) design and wherein the second IC design is a field-programmable gate array (FPGA) design.

4. The method of claim 1, wherein the determining of the plurality of logic elements comprises flagging each of the plurality of logic elements in the second IC design as an element in the emulated logic block.

5. The method of claim 4, wherein the grouping of the plurality of connected logic elements includes creating a boundary around the plurality of flagged logic elements in the second IC design.

6. A non-transitory machine-readable storage medium encoded with sequences of instructions for compiling a first integrated circuit (IC) design, the sequences of instructions which when executed, cause a machine to perform:
- identifying a logic block in the first IC design, wherein the logic block is a non-existent resource in a second IC design;
- identifying a plurality of logic elements in the second IC design, wherein the plurality of logic elements is connectable to perform functions associated with the logic block in the first IC design, wherein at least one of the plurality of logic elements in the second IC design is different from any logic elements from the logic block in the first IC design;
- placing a partition around the plurality of logic elements to form an emulated logic block in the second IC design based on the logic block in the first design; and
- comparing the first IC design with the second IC design, wherein a first set of keypoints in the first IC design is compared with a second set of keypoints in the second IC design "the second IC design" insertion: wherein the first set of keypoints comprises input and output terminals on the logic block and the second set of keypoints comprises input and output terminals of the emulated logic block, and wherein the emulated logic block in the second logic block is compared with the logic block in the first IC design.

7. The machine-readable medium of claim 6, further comprising:
- performing a place and route operation on the second IC design to place and route the emulated logic block.

8. The machine-readable medium of claim 6, wherein the comparing excludes the plurality of logic elements in the emulated block when comparing the emulated logic block in the second IC design with the logic block in the first IC design.

9. The machine-readable medium of claim 6, further comprising:
- flagging each of the plurality of logic elements before the placing of the partition, wherein the plurality of logic elements is grouped according to the flagging.

10. The machine-readable medium of claim 6, wherein the first IC design is implemented on an application specific integrated circuit (ASIC) device and the second IC design is implemented on a companion field programmable gate array (FPGA) device.

* * * * *